United States Patent
Bassom et al.

(10) Patent No.: US 6,838,380 B2
(45) Date of Patent: Jan. 4, 2005

(54) FABRICATION OF HIGH RESISTIVITY STRUCTURES USING FOCUSED ION BEAMS

(75) Inventors: Neil J. Bassom, Hamilton, MA (US); Tung Mai, Dorchester, MA (US)

(73) Assignee: FEI Company, Hillsboro, OR (US)

( * ) Notice: Subject to any disclaimer, the term of this patent is extended or adjusted under 35 U.S.C. 154(b) by 54 days.

(21) Appl. No.: 10/055,320

(22) Filed: Jan. 23, 2002

(65) Prior Publication Data

US 2002/0102861 A1 Aug. 1, 2002

Related U.S. Application Data

(60) Provisional application No. 60/264,472, filed on Jan. 26, 2001.

(51) Int. Cl.[7] .............................................. H01L 21/44
(52) U.S. Cl. ....................... 438/680; 438/771; 438/763; 438/641; 438/676
(58) Field of Search ................................ 438/771, 763, 438/961, 776, 765, 766, 772, 773, 777, 778, 641, 658, 659, 676

(56) References Cited

U.S. PATENT DOCUMENTS

| | | | |
|---|---|---|---|
| 4,845,054 A | * | 7/1989 | Mitchener .................... 437/238 |
| 4,876,112 A | | 10/1989 | Kaito et al. .................... 427/38 |
| 4,950,498 A | * | 8/1990 | Kaito ............................ 427/38 |
| 5,083,033 A | * | 1/1992 | Komano et al. ........... 250/492.2 |
| 5,104,684 A | | 4/1992 | Tao et al. ....................... 427/38 |
| 5,196,102 A | * | 3/1993 | Kumar ......................... 427/528 |
| 5,429,730 A | * | 7/1995 | Nakamura et al. ....... 204/192.34 |
| 5,435,850 A | | 7/1995 | Rasmussen .................. 118/726 |
| 5,824,598 A | * | 10/1998 | Yamaguchi et al. ......... 438/676 |
| 5,827,786 A | | 10/1998 | Puretz .......................... 438/789 |
| 5,844,416 A | * | 12/1998 | Campbell et al. ............ 324/750 |
| 5,851,413 A | | 12/1998 | Casella et al. ................. 216/92 |
| 5,907,792 A | * | 5/1999 | Droopad et al. ............. 438/791 |
| 5,976,976 A | * | 11/1999 | Doan et al. .................. 438/683 |
| 6,159,867 A | * | 12/2000 | Sharan et al. ................ 438/771 |
| 6,261,850 B1 | * | 7/2001 | Marsh ............................ 438/4 |
| 6,265,327 B1 | * | 7/2001 | Kobayashi et al. .......... 438/776 |
| 6,492,261 B2 | * | 12/2002 | Gavish et al. ............... 438/637 |

* cited by examiner

Primary Examiner—Matthew Smith
Assistant Examiner—Renzo N. Rocchegiani
(74) Attorney, Agent, or Firm—Michael O. Scheinberg

(57) ABSTRACT

The present invention provides a method for creating microscopic high resistivity structures on a target by directing a focused ion beam toward an impact point on the target and directing a precursor gas toward the impact point, the ion beam causing the precursor gas to decompose and thereby deposit a structure exhibiting high resistivity onto the target. The precursor gas preferably contains a first compound that would form a conductive layer and a second compound that would form an insulating layer if each of the first and second compounds were applied alone in the presence of the ion beam.

24 Claims, 3 Drawing Sheets

FABRICATION OF HIGH RESISTIVITY STRUCTURES USING FOCUSED ION BEAMS

This application claims priority from U.S. Provisional Patent Application No: 60/264,472, filed Jan. 26, 2001.

TECHNICAL FIELD OF THE INVENTION

The invention relates to the use of charged particle beam systems to fabricate conductive microscopic structures having high electrical resistivity and, in particular, to the use of focused ion beam systems to fabricate electronic circuit elements.

BACKGROUND OF THE INVENTION

Focused ion beams (FIBs) can be focused to a spot smaller than one tenth of a micron. Because of their small spot size, focused ion beam systems are used to create and alter microscopic structures. Focused ion beams can micromachine material by sputtering or etching, that is, physically knocking atoms or molecules from the target surface. Focused ion beams can also be used to deposit material, using a precursor gas that adheres to the specimen surface and decomposes in the presence of the ion beam to leave a deposit on the surface. FIB systems are widely used in the semiconductor industry to alter prototype integrated circuits by depositing metallic paths to create new connections and by etching metallic paths to eliminate connections. Using a FIB system to alter a circuit allows a circuit designer to test variations of the circuit without undertaking the lengthy process of modifying the photolithography masks and fabricating a new circuit from scratch.

To deposit a conductive path using a FIB system, the system operator directs a jet of precursor gas, typically an organometallic compound such as tungsten hexacarbonyl, to the surface of the specimen while a focused ion beam scans the area upon which the conductor is to be deposited. A metallic layer is deposited only in the area impacted by the beam. Because the ion beam can be focused to a diameter of less than one tenth of a micron, a very fine conductor can be deposited. An ion beam assisted deposition process is described, for example, in U.S. Pat. No. 4,876,112 to Kaito et al. for a "Process for Forming Metallic Patterned Film" and U.S. Pat. No. 5,104,684 to Tao et al. for "Ion Beam Induced Deposition of Metals."

It is also known to use an ion beam process to deposit an insulating material. An electrically insulating material may be deposited, for example, before depositing a conductive path to prevent the new conductive path from electrically contacting an existing conductor. U.S. Pat. No. 5,827,786 to Puretz for "Charged Particle Deposition of Electrically Insulating Films" describes a procedure for depositing an electrically insulating material.

At times, a circuit designer needs to include in his circuit a conductive element having greater electrical resistance than the deposited metallic conductor described above. Current ion beam deposition methods that deposit tungsten or other metal-based materials by the decomposition of precursor gases are incapable of depositing conductors having high electrical resistance.

The electrical resistance of any particular conductor is determined by its resistivity, which is a property of the material itself, and its dimensions. The resistance is equal to the resistivity divided by the cross sectional area of the conductor multiplied by its length. That is, for conductors composed of materials having the same resistivity, a longer conductor has more resistance than a shorter one and a thinner conductor has greater resistance than a thicker one.

The resistivities of typical ion-beam deposited materials are typically in the range of between one hundred micro-ohm-centimeter and five hundred micro-ohm-centimeter. While these resistivity values are much higher than those of bulk metals, the typical microscopic dimensions of microcircuit connections result in typical resistances of around 100 ohms. Such a low resistance is effectively a short circuit between the points it connects.

Currently, the only way to deposit a conductor having high resistance is to deposit a long, narrow conductor. To make the conductor long, it is often necessary to deposit the conductor in a winding path. Even so, the highest resistance practically obtainable by this method is a few thousand ohms. There is no method for producing structures having resistances in the range of one megohm to one hundred megohms.

The ability to create high resistance structures would have numerous applications in circuit modification, particularly of analog circuits.

SUMMARY OF THE INVENTION

An object of the invention is to provide microscopic conductive structures having high electrical resistance. The invention is particularly well suited to creating such structures in integrated micro-electronic circuits.

The invention entails using a charged particle beam to activate a precursor gas or gases, thereby depositing a material having a resistivity between that of an ion beam deposited metal material and an ion beam deposited insulator material. By controlling the positioning of the charged particle beam and the flow of the precursor gas or gases, high resistivity conductive material can be precisely deposited to form microscopic structures having predetermined resistances.

The preferred precursor gas comprises two gaseous compounds: a first gaseous compound that when directed toward a target in the presence of a charged particle beam and without the presence of other gases results in the deposition of a conductive material and a second gaseous compound that when directed toward a target in the presence of a charged particle beam and without the presence of other gases results in the deposition of an insulating material.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF THE PREFERRED EMBODIMENTS

Figure 1:
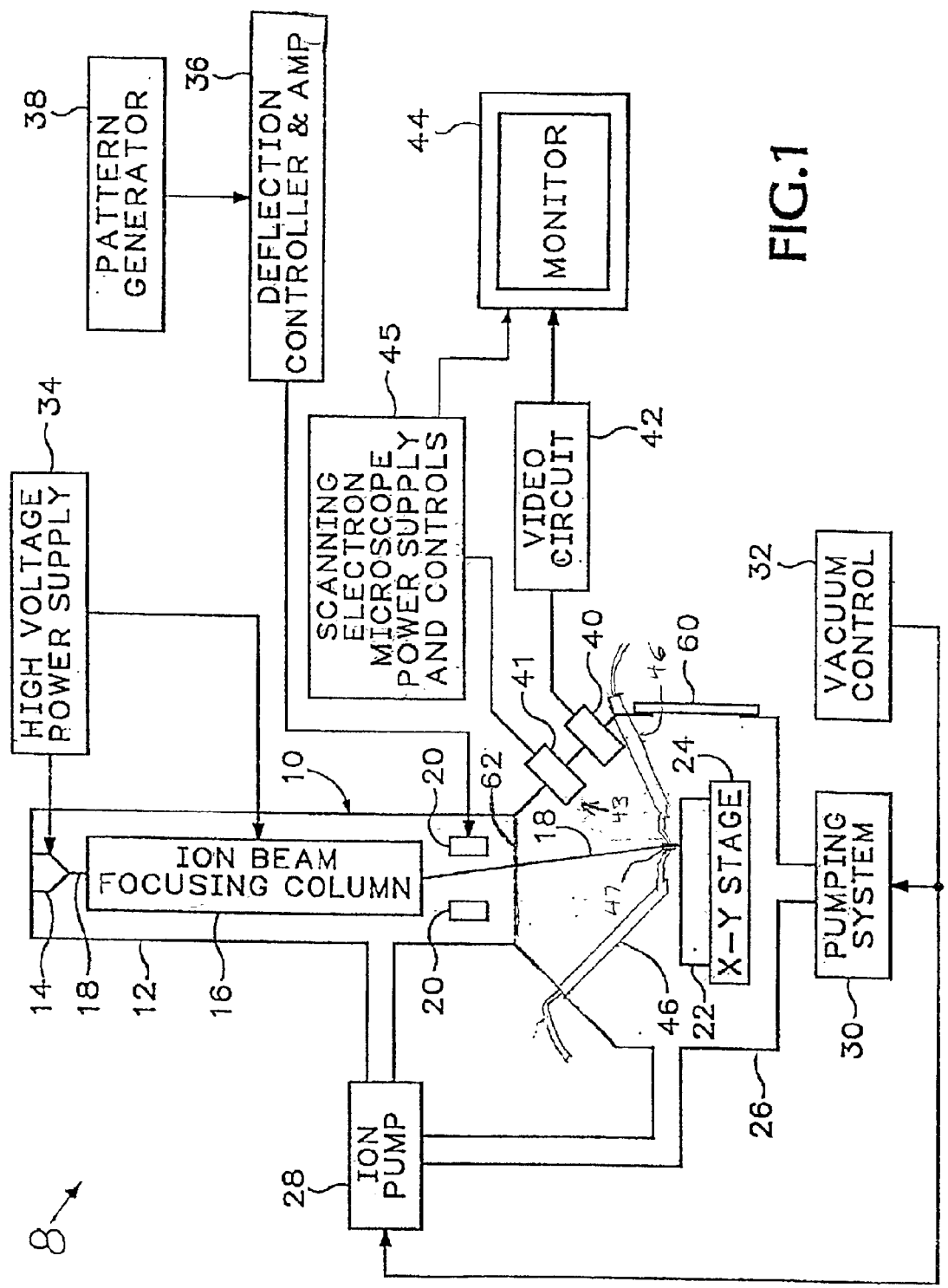
FIG. 1 is a focused ion beam system used to deposit a high resistivity material in accordance with the present invention

FIG. 1 shows schematically a typical focused ion beam system 8 used to implement a preferred embodiment of the present invention. Focused ion beam system 8 includes an evacuated envelope 10 having an upper neck portion 12 within which are located a liquid metal ion source 14 and a focusing column 16 including extractor electrodes and an electrostatic optical system. Ion beam 18 passes from source 14 through column 16 and between electrostatic deflection mechanism schematically indicated at 20 toward specimen 22, which comprises, for example, a semiconductor device positioned on movable X-Y stage 24 within lower chamber 26. Lower chamber 26 can be vacuum isolated from evacuated envelope 10 by a valve 62.

An ultra high vacuum pump, such as an ion pump 28, is employed for evacuating neck portion 12. The chamber 26 is evacuated with turbo-molecular and mechanical pumping system 30 under the control of vacuum controller 32. The vacuum system provides within chamber 26 a vacuum of between approximately $1\times10^{-7}$ Torr and $5\times10^{-4}$ Torr. When a precursor gas is being applied in accordance with the present invention, the chamber background pressure is typically about $1\times10^{-5}$ Torr.

High voltage power supply 34 is connected to liquid metal ion source 14 as well as to appropriate electrodes in focusing column 16 for forming an approximately 1 keV to 60 keV ion beam 18 and directing the same downwardly. Deflection controller and amplifier 36, operated in accordance with a prescribed pattern provided by pattern generator 38, is coupled to deflection plates 20 whereby beam 18 may be controlled to trace out a corresponding pattern on the upper surface of specimen 22. In some systems the deflection plates are placed before the final lens, as is well known in the art.

The source 14 typically provides a metal ion beam of gallium ions, although other ions and ion sources, such as a multi-cusp or other plasma ion source, can be used. The source typically is capable of being focused into a sub-one-tenth micron wide beam at specimen 22 for either modifying the surface of specimen 22 by ion milling, enhanced etch, material deposition, or for the purpose of imaging the surface of specimen 22. A charged particle multiplier 40 used for detecting secondary ion or electron emission for imaging is connected to video circuit and amplifier 42, the latter supplying drive for a video monitor 44, which also receives deflection signals from controller 36. The location of charged particle multiplier 40 within chamber 26 can vary in different embodiments. A scanning electron microscope 41, along with its power supply and controls 45, are optionally provided with the FIB system 8.

Figure 2:
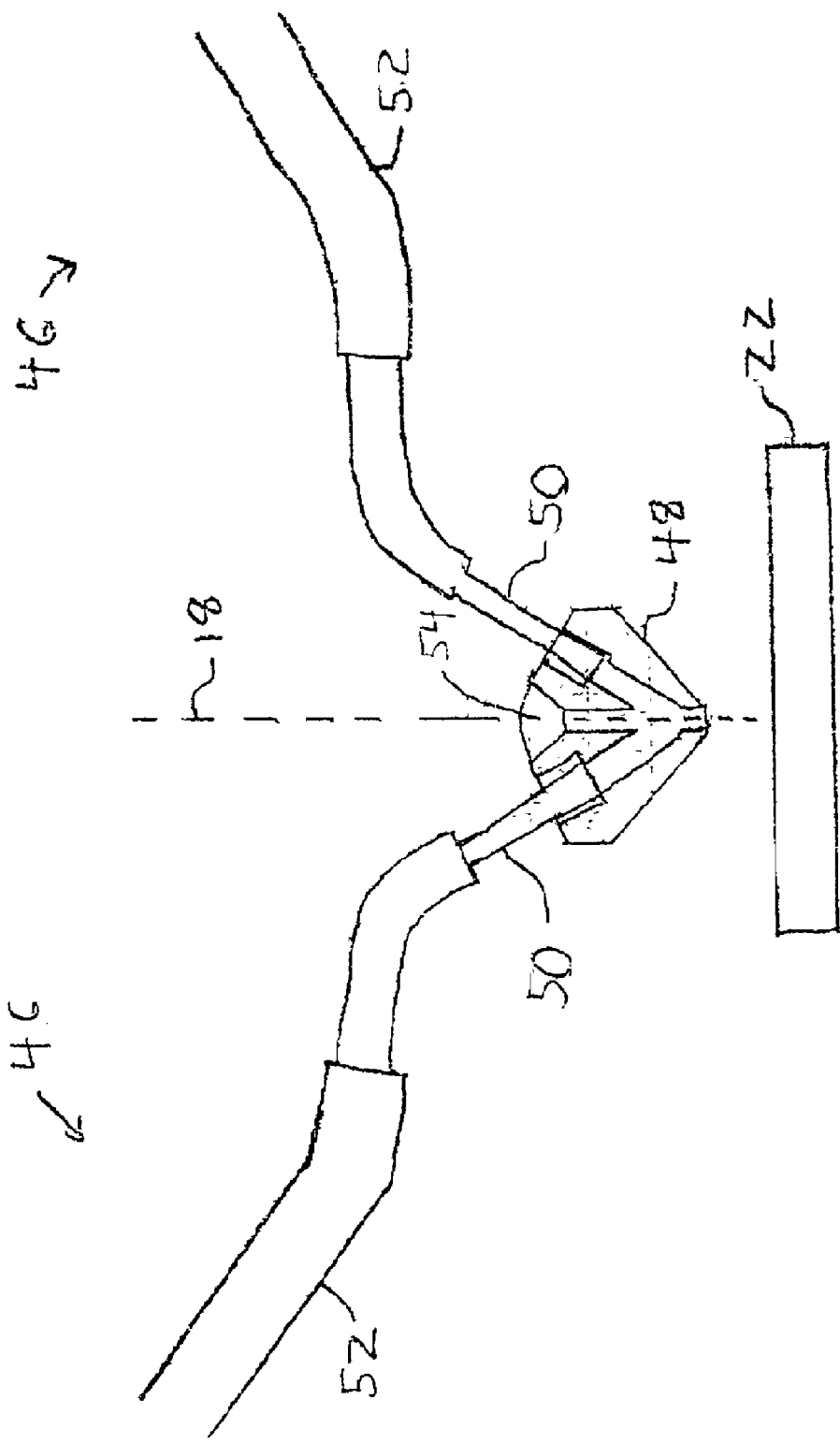
FIG. 2 shows a portion of a gas injection system of the present invention.

FIB system 8 includes a fluid delivery system 46 for introducing and directing gaseous vapor toward specimen 22. U.S. Pat. No. 5,851,413 to Casella et al. for "Gas Delivery Systems For Particle Beam Processing," assigned to the assignee of the present invention, describes a suitable fluid delivery system 46 that is capable of simultaneously delivering fluids from multiple sources. FIG. 2 shows an enlarged view of a portion of fluid delivery system 46. Fluid delivery system 46 includes a concentrator 48 and one or more fluid conduits 50 with corresponding extension arms 52. Concentrator 48 includes an aperture 54 allowing passage of ion beam 18 and inlets for accepting fluid conduits 50. Fluids pass through the extension arms 52 and are concentrated by concentrator 48 onto the specimen 22 at the impact point of the focused ion beam 18. Alternatively, gas delivery system 46 could comprise two independent gas sources, each having a nozzle at the end of a gas passage, to direct two jets of gaseous compounds toward the impact point of the focused ion beam. Another gas delivery system is described in U.S. Pat. No. 5,435,850 to Rasmussen for a "Gas Injection System."

A door 60 (FIG. 1) is opened for inserting specimen 22 on stage 24 which may be heated or cooled. The door is interlocked so that it cannot be opened if the system is under vacuum. The high voltage power supply provides an appropriate acceleration voltage to electrodes in ion beam column 16 for energizing and focusing ion beam 18. Focused ion beam systems are commercially available, for example, from FEI Company, Hillsboro, Oreg. the assignee of the present application.

According to the present invention a high resistivity material is deposited on a specimen 22 by directing focused ion beam 18 toward an impact point on the specimen 22 and directing one or more precursor gases toward the ion beam impact point, the ion beam causing the precursor gas to decompose and thereby deposit a structure exhibiting high resistivity onto the target. By controlling the positioning of the focused ion beam, the high resistivity material can be deposited in a precisely defined pattern. By controlling the flow of the precursor gas or gases, the resistance of the deposited structures can be controlled.

In a preferred embodiment, two independent gas injection systems operate to simultaneously provide two gaseous compounds at the impact point of the focused ion beam. The first compound, if injected individually, would decompose in the presence of the ion beam to deposit an electrically conductive material. The second compound, if injected individually, would decompose in the presence of the ion beam to deposit an electrically insulating material. When both compounds directed to the specimen 22 simultaneously in the presence of the focused ion beam, a high resistivity material is deposited.

Figure 3:
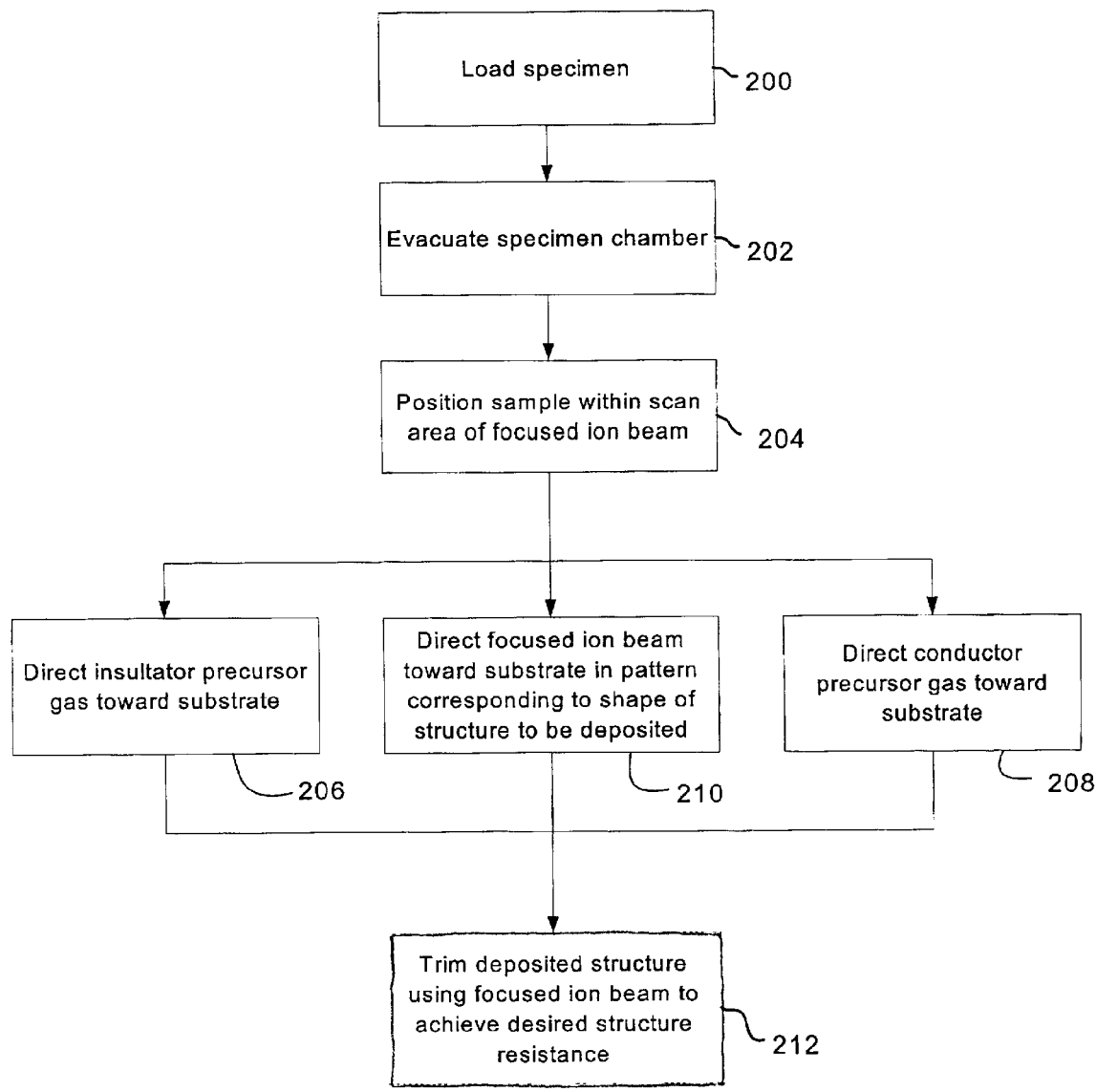
FIG. 3 is flow chart showing the steps of a preferred method of the present invention.

In one preferred embodiment, the first compound comprises a metal precursor, for example, an organometallic compound such as tungsten hexacarbonyl, and the second compound comprises an insulating material precursor, for example, a siloxane compound such as tetramethylcyclotetrasiloxane (TMCTS). FIG. 3 shows the steps of a preferred method of the present invention. In step 200, a specimen 22 is loaded onto x-y stage 24 through door 60 of lower chamber 26. In step 202, lower chamber 26 is evacuated and valve 62 is opened to provide a path to specimen 22 for focused ion beam 18. In step 204, x-y stage 24 is moved to position the region at which the high resistivity material is to be deposited on specimen 22 within the scan area of focused ion beam 18. In step 206, an insulator precursor gaseous compound is directed toward the specimen 22. Simultaneously, in step 208, a conductor precursor gaseous compound is directed toward the specimen 22. While the precursor gaseous compounds are being directed toward specimen 22, the ion beam 18 is directed in step 210 in a pattern corresponding to the structure that is to be deposited. The pattern to be deposited can be designated by a system operator on monitor 44 and pattern generator 38 can cause deflection controller and amplifier 36 to control deflection electrodes 20 to cause beam 18 to scan the designated pattern. Optional step 212 shows that the deposited structure is trimmed using the focused ion beam to obtain a structure having the desired resistance value to a high degree of precision.

In one embodiment, step 206 entails directing a siloxane compound from concentrator 48 or from a nozzle of gas injection system 46 toward the specimen 22. Only a small amount of siloxane is required, and applicants have found that adjusting gas injection system 46 to a baratron pressure setting of 0.2 Torr provides an adequate amount of siloxane in an FEI 8000 Series FIB system. Skilled persons will understand that the gas pressure at the sample in the chamber is only indirectly related to the pressure in the gas injection system. The required pressure will vary from system to system and can be readily determined by varying the pressure until the desired results are achieved. Increasing the siloxane concentration was found to result in faster growth and increased contact resistance, but no change in the conductivity of the deposited structure. In one embodiment, step 208 entails directing a standard precursor for metal deposition directed toward specimen 22. The siloxane gas and the metal deposition precursor gas mix in concentrator 48 and near the surface of specimen 22. If separate nozzles are used for each gas, the gases mix near the surface of specimen 22 rather than in a concentrator. The method of delivering and mixing the gases is not critical, and any method that delivers the gases to the surface at the impact point of the ion beam is suitable. Some precursor compounds can be premixed and flow through a single gas distribution system, but some precursor gases are reactive and should not be mixed beforehand.

In one embodiment, step 210 comprises directing a 569 pico-ampere, 50 kilovolt beam toward specimen 22, using conventional beam parameter settings, such as pixel spacing and beam dwell time, as appropriate for the structure to be deposited. For example, a typical pixel spacing is 0.07 microns, with the primary ion beam dwelling at each pixel for about 0.5 microseconds. A typical refresh rate, that is, the time required to return to each pixel, is approximately 3,500 microseconds. As is known in the art, the ion beam parameters and gas flow parameters are adjusted to avoid the ion beam depleting the precursor gas adhered to the surface during a dwell period while minimizing the unreacted precursor gas that must be exhausted from the vacuum chamber.

The simultaneous flow of the insulator precursor and the conductor precursor in the presence of the ion beam results in the deposition of a conductive metallic structure exhibiting relatively high resistivity. Precursor gasses for metal deposition may include a platinum or tungsten organometallic or inorganic compounds, as well as compounds of other conductors. The flow rate of such organometallic compound can typically be controlled by controlling the temperature of the chamber in which the precursor material is stored. Suitable siloxane compounds for use as the insulating material precursor compound include TMCTS and octamethylcyclotetrasiloxane (OMCTS). The siloxane compounds require a valved fluid delivery system, such as the gas delivery system described in U.S. Pat. No. 5,851,413.

Applicants have employed the method of the present invention to grow structures of various sizes on a variety of specimens. In particular, test wafers were formed having a four point probe configuration that allowed measurement of both the resistivity and contact resistance of the deposited high resistivity structure. A large variety of structures were tested to determine their resistance characteristics using the four point probe method. The resistivities of deposited resistive structures were measured to be between about $5 \times 10^4$ ohms per square and about $7 \times 10^4$ ohms per square.

Contact resistances were measured and found to be between one megohm and two megohms, although the contact resistance may vary with the precursor gases used.

Further, deposited structures, measured by both the two and four point probe methods, exhibited linear current-voltage characteristics over a voltage range of greater than ten volts. Voltages within the linear voltage-current range are suitable for operation of typical integrated circuits.

The resistance of structures deposited in accordance with the invention can be varied by varying the width and length of the resistive deposition, thus allowing a specific resistance value to be achieved. The resistances of structures, measured by both the two point probe method and the four point probe method, were inversely proportional to the width of the deposited conductor. Thus, a structure of a desired resistance can be constructed by depositing a high resistivity conductor of the appropriate width, which can be readily determined once a deposition process is characterized for specific precursor compounds and flow rates and ion beam parameters. For greater precision, a deposited structure can have its resistance increased to a specified value by FIB milling of the deposition following measurement of its resistance. Typical structures can have widths typical of those currently deposited by focused ion beams. Such widths can be less than a few microns, less than one micron, or even less than 0.5 microns.

The method of the invention can produce resistive structures, for example, less than $1000 \mu m$ long, and having resistances of greater than 100 kilohm, greater than 500 kilohm, greater than one megohm, greater than 10 megohm, or greater than 25 megohm. The invention can also produce structures, for example, less than $500 \mu m$ long or less than $250 \mu m$ long having those resistances. The invention can produce structures less than $100 \mu m$ long and having resistances greater than 100 kilohm, greater than 500 kilohm, greater than one megohm, greater than 5 megohm, or greater than 10 megohm.

For example, a $0.4 \mu m$ wide structure that is about $250 \mu m$ long has a resistivity of about 25 megohm. A structure about $50 \mu m$ long and about $5 \mu m$ wide has a resistivity of about 500 kilohm. Structures about one micron wide and $100 \mu m$ long have typical resistances of about four to five megohm. Lengthy conductors can be deposited in winding patterns to provide structures having resistances up to around 900 megohm, and extremely short, wide conductors can have resistances limited primary by the contact resistance.

The rate of deposition growth and contact resistance was found to increase with the concentration of siloxane in the mixture of compounds used to form the deposition, but the siloxane concentration does not appear to change the conductivity. It is found that structures differing only in thickness exhibit the same conductivity. Thus, it may be assumed that the composition of the structure changes as growth proceeds. In fact, an examination of the cross section of a structure reveals a distinct interface layer formed between a first conductive layer formed below the interface layer and a second non-conductive layer above the interface layer. The ion dose required to form the interface layer is about 0.3 nanocouloumbs per square micron ($nC/\mu m^2$).

The present invention enables the deposition of high resistance structures that exhibit resistances well above several kilohms without the necessity of forming conductors of impractical length. Conversely, the present invention enables the achievement of resistance values that are not so high as to effectively be insulating. In particular, the present invention enables the production of structures exhibiting resistances between about 1 megohm and about 900 megohms, with structures having resistances of less than about 100 megohm and greater than about 3 megohms, about 5 megohms or about 10 megohms being readily producible. As routine experiments are performed with additional precursor materials, the range of resistances available may increase without departing from the principles of the invention. Many such precursor materials are described in the scientific literature. Different precursor materials may deposit structures having different resistivities or different contact resistances to obtain structures having greater or lower resistance. Because the lower limit of a deposited structure's resistance is determined by its contact resistance, different precursor gases may produce structures having reduced contact resistance and therefore reduced overall resistance without departing from the principles of the invention.

When two precursor gaseous compounds are directed toward the specimen, the two precursor compounds can be considered to be two precursor gases or to be a single precursor gas composed of the two compounds. Although the invention is described as using a focused ion beam, some precursors may be amenable to other types of charged particle beams, such as electron beams.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of creating a high resistivity conductive material on a target, comprising:
    directing a focused ion beam toward an impact point on the target; and
    directing one or more precursor gases toward the impact point, the ion beam causing the precursor gas to decompose and thereby deposit a high resistivity conductive material onto the target, wherein the one or more precursor gasses include at least one conductive and at least one non-conductive precursor.

2. The method of claim 1 in which the high resistivity conductive material has a resistivity of between about $5 \times 10^4$ ohms per square and about $7 \times 10^4$ ohms per square.

3. The method of claim 1 in which the high resistivity conductive material deposited on the target forms a structure and in which the structure has a resistance of less than 900 megohms.

4. The method of claim 1 in which the high resistivity conductive material deposited on the target forms a structure and in which the structure has a resistance of between one megohm and 100 megohms.

5. The method of claim 1 in which directing a focused ion beam onto the target includes directing the focused ion beam to deposit a high resistivity conductive structure having a length of less than 500 µm and a resistance of greater than 0.5 megohm.

6. A method of creating a high resistivity conductive material on a target, comprising:
    directing a focused ion beam toward an impact point on the target; and
    directing one or more precursor gases toward the impact point, the ion beam causing the precursor gas to decompose and thereby deposit a high resistivity conductive material onto the target, the one or more precursor gases comprising a first precursor compound that when applied alone to a target in the presence of an ion beam decomposes in the presence of the ion beam to produce a conductive material and a second precursor compound that when applied alone to a target in the presence of an ion beam decomposes in the presence of the ion beam to product an insulating material.

7. The method of claim 6 in which the first precursor compound includes an organometallic compound.

8. The method of claim 7 in which the first precursor compound includes a platinum or tungsten organometallic compound.

9. The method of claim 6 in which directing one or more precursor gases toward the impact point includes simultaneously directing the first precursor compound and the second precursor compound toward the impact point.

10. A method of creating a high resistivity conductive material on a target, comprising:
    directing a focused ion beam toward an impact point on the target; and
    directing one or more precursor eases toward the impact point, the ion beam causing the precursor gas to decompose and thereby deposit a high resistivity conductive material onto the target, the one or more precursor gases comprising a first precursor compound that when applied alone to a target in the presence of an ion beam decomposes in the presence of the ion beam to produce a conductive material and a second precursor compound that when applied alone to a target in the presence of an ion beam decomposes in the presence of the ion beam to produce an insulating material, wherein the second precursor compound deposits a compound containing silicon.

11. The method of claim 10 in which the second precursor compound includes a siloxane compound.

12. The method of claim 10 in which the second precursor compound includes OMCTS or TMCTS.

13. A method for creating a high resistance conductive structure on a target, comprising the steps of:
    providing a first precursor compound and a second precursor compound in the presence of a focused ion beam, wherein said first precursor compound is a conductive precursor and said second precursor compound is a non-conductive precursor; and
    causing the deposition of a structure onto the target wherein the presence of the first and second precursor compounds cause the conductive structure to exhibit a high resistivity.

14. The method of claim 13, wherein the resistance of the structure is controllable by controlling the length or width of the structure.

15. The method of claim 13, wherein the rate of deposition is controllable according to the relative concentrations of the first and second precursor compounds.

16. The method of claim 13, wherein the high resistance structure exhibits a linear voltage-current relationship over a voltage range of greater than 10 volts.

17. The method of claim 13 in which the structure has a resistance as measured by both a two point probe method and a four point probe method of between one megohm and 900 megohms.

18. The method of claim 13 in which the structure has a resistance as measured by both a two point probe method and a four point probe method of between one megohm and 100 megohms.

19. The method of claim 13 wherein providing a first precursor compound and a second precursor compound in the presence of a focused ion beam includes providing a first precursor compound and a second precursor simultaneously.

20. The method of claim 13, wherein providing a first precursor compound and a second precursor compound includes providing a first precursor compound from a first precursor outlet and a second precursor compound from a second precursor outlet.

21. The method of claim 13, wherein providing a first precursor compound and a second precursor compound includes providing a first precursor compound and a second precursor compound from a single precursor outlet.

22. The method of claim 13, wherein providing a first precursor compound and a second precursor compound in the presence of a focused ion beam includes alternately providing a first precursor compound and a second precursor.

23. A method for creating a high resistance conductive structure on a target, comprising the steps of:

providing a first precursor compound and a second precursor compound in the presence of a focused ion beam; and causing the deposition of a structure onto the target wherein the presence of the first and second precursor compounds cause the conductive structure to exhibit a high resistivity, wherein the high resistance structure exhibits an interface layer between a conductive layer and a non-conductive layer.

24. A method of creating a high resistivity conductive material on a target, comprising:

directing a focused ion beam toward an impact point on the target; and directing one or more precursor gases toward the impact point, the ion beam causing the precursor gas to decompose and thereby deposit a high resistivity conductive material onto the target, the one or more precursor gases comprising a first precursor compound that when applied alone to a target in the presence of an ion beam decomposes in the presence of the ion beam to produce a conductive material and a second precursor compound that when applied alone to a target in the presence of an ion beam decomposes in the presence of the ion beam to product an insulating material, wherein directing one or more precursor gases toward the impact point includes alternatively directing the first precursor compound and the second precursor compound toward the impact point.

* * * * *